(12) United States Patent
Nakajima (10) Patent No.: US 11,726,888 B2
(45) Date of Patent: Aug. 15, 2023

(54) MEMORY FAULT HANDLING SYSTEM, INFORMATION PROCESSING DEVICE, AND MEMORY FAULT HANDLING METHOD

(71) Applicant: NEC Platforms, Ltd., Kawasaki (JP)

(72) Inventor: Eiji Nakajima, Kanagawa (JP)

(73) Assignee: NEC Platforms, Ltd., Kanagawa (JP)

(*) Notice: Subject to any disclaimer, the term of this patent is extended or adjusted under 35 U.S.C. 154(b) by 20 days.

(21) Appl. No.: 17/437,193

(22) PCT Filed: Mar. 16, 2020

(86) PCT No.: PCT/JP2020/011396
§ 371 (c)(1),
(2) Date: Sep. 8, 2021

(87) PCT Pub. No.: WO2020/189617
PCT Pub. Date: Sep. 24, 2020

(65) Prior Publication Data
US 2022/0171686 A1 Jun. 2, 2022

(30) Foreign Application Priority Data

Mar. 19, 2019 (JP) .................................. 2019-051453

(51) Int. Cl.
*G06F 11/20* (2006.01)
*G06F 11/14* (2006.01)

(52) U.S. Cl.
CPC ........ *G06F 11/2094* (2013.01); *G06F 11/142* (2013.01)

(58) Field of Classification Search
CPC ............. G06F 11/2094; G06F 11/0727; G06F 11/142; G06F 11/3034; G06F 11/3037
See application file for complete search history.

(56) References Cited

U.S. PATENT DOCUMENTS 9,424,146 B2 * 8/2016 Yang .................... G06F 3/0688
2004/0168101 A1 8/2004 Kubo
(Continued)

FOREIGN PATENT DOCUMENTS

JP H11-175409 A 7/1999
JP 2003-303139 A 10/2003
(Continued)

OTHER PUBLICATIONS

International Search Report for PCT Application No. PCT/JP2020/011396, dated Jun. 16, 2020.
(Continued)

*Primary Examiner* — Yolanda L Wilson (57) ABSTRACT

A memory fault handling system includes: a memory controller, firmware, and software. The memory controller has: an error occurrence notification means for, when the occurrence of a memory error is detected, notifying firmware or software of the occurrence of the memory error on the basis of a setting pertaining to a notification recipient. The firmware includes: a notification recipient setting means for setting a notification recipient; and a spare memory switching instruction means for, when a notification indicating the occurrence of a memory error is received from the memory controller, instructing to switch from a memory to a spare memory. The software includes: a disabling instruction means for, when a notification indicating the occurrence of a memory error is received from the memory controller, instructing to cause a page corresponding to the memory in which the memory error has occurred to be disabled.

7 Claims, 8 Drawing Sheets

(56) References Cited

U.S. PATENT DOCUMENTS

| | | | | |
|---|---|---|---|---|
| 2010/0318845 A1* | 12/2010 | Kohiga | ............... | G06F 11/0793 |
| | | | | 714/15 |
| 2011/0179318 A1* | 7/2011 | Sekimoto | ............ | G06F 11/1048 |
| | | | | 714/708 |
| 2012/0117445 A1* | 5/2012 | Lu | ....................... | G06F 11/1666 |
| | | | | 714/763 |
| 2015/0243373 A1 | 8/2015 | Chun et al. | | |
| 2020/0142824 A1* | 5/2020 | Koladi | ................ | G06F 11/1666 |

FOREIGN PATENT DOCUMENTS

| | | |
|---|---|---|
| JP | 2011-150469 A | 8/2011 |
| JP | 2017-506391 A | 3/2017 |
| WO | 2008/099786 A1 | 8/2008 |

OTHER PUBLICATIONS

Japanese Office Communication for JP Application No. 2019-051453 dated Feb. 18, 2020 with English Translation.

* cited by examiner

MEMORY FAULT HANDLING SYSTEM, INFORMATION PROCESSING DEVICE, AND MEMORY FAULT HANDLING METHOD

This application is a National Stage Entry of PCT/JP2020/011396 filed on Mar. 16, 2020, which claims priority from Japanese Patent Application 2019-051453 filed on Mar. 19, 2019, the contents of all of which are incorporated herein by reference, in their entirety.

TECHNICAL FIELD

The present invention relates to a memory fault handling system, an information processing device, and a memory fault handling method.

BACKGROUND ART

In recent years, a technique called in-memory computing in which a server device is equipped with several tens of terabytes of memory and data required for calculation is stored in the memory to greatly increase the rate of calculation processing has been able to be utilized by virtue of the decrease in price and increase in capacity of dynamic random access memories (DRAM). In in-memory computing, the integrity of data in a memory is important. On the other hand, a frequency of errors occurring is also increasing along with an increase in integration and capacity of dual inline memory modules (DIMMs). Memory errors include a correctable error which is corrected by means of an error check and correct (ECC) function (hereinafter referred to as a "CE") and an uncorrectable error which cannot be corrected by means of an ECC function (hereinafter referred to as a "UCE"). When a CE occurs in a plurality of pieces of data at the same time, the data cannot be corrected by means of an ECC function and thus the data is a UCE. When a UCE occurs, a system goes down.

On the other hand, in computer systems in recent years, hardware (hereinafter referred to as "HW") and software (hereinafter referred to as "SW") have been equipped with a handling function for when a CE occurs therein.

The HW has a function of, when the number of times a CE has occurred reaches a threshold value in a certain DRAM, determining that the DRAM is out of order and transferring data to a spare DRAM (hereinafter may be referred to as an "HW function" in some cases).

On the other hand, the SW has a function called page offline. When receiving a notification concerning the occurrence of a CE in a memory, the SW counts the number of times a CE has occurred on a page-by-page basis. When the number of times a CE has occurred on a certain page reaches a threshold value, the SW provides an instruction to a kernel to cause the page to be disabled. If the page has available data included therein but is not used at that time, the kernel transfers data to another physical page and performs control so that the original page is not used. This is called a page offline function (hereinafter may be referred to as a "SW function" in some cases).

However, generally, the HW function and the SW function do not operate in cooperation with each other and may perform an inefficient operation in some cases. For example, a plurality of DRAMs may be mapped to a page to be managed by means of SW through memory interleaving. For this reason, for example, when CEs occur in three DRAMs, the SW counts a CE as having occurred three times on that page. Thus, the number of times a CE has occurred managed by the SW for that page may reach a threshold value before the number of times a CE has occurred managed by HW for each DRAM in some cases. Therefore, although the HW function (data copy to the spare DRAM) can be performed, the SW function (a page offline) operates first. When the page offline function operates, there are effects such as (1) a decrease in the number of memory pages which can be used by a user and (2) the occurrence of an overhead which is the transferring of data by means of the kernel.

On the other hand, a function on the HW side uses the spare DRAM and transfers data using a COPY engine included in the HW. For this reason, there is no effect on SW by virtue of the function on the HW side. Therefore, when the function on the HW side is operated first and a memory CE still occurs, it is preferable to operate a page offline on the SW side as a last resort.

Patent Document 1 discloses a mechanism for linking the HW function and the SW function in accordance with such a policy. Patent Document 1 discloses a memory fault handling system which prevents a system down by linking spare memory switching corresponding to the HW function and page blockage corresponding to the SW function.

The memory fault handling system performs control in which the memory fault handling system first switches, when the number of times a memory CE has occurred reaches a threshold value, a memory in which the memory CEs have occurred to the spare memory and then performs page blockage when the number of times a memory CE has occurred reaches a threshold value. Thus, the memory fault handling system links spare memory switching and page blockage.

When an operation when page blockage is performed is described in more detail, a fault page notification part 62 installed in firmware (hereinafter referred to as "FW") notifies a page blocking part 63 installed in an operating system (OS) of a memory page corresponding to a position in which a fault has occurred. Moreover, the page blocking part 63 searches for the notified page and performs a page blockage.

CITATION LIST

Patent Literature

[Patent Document 1]
Japanese Unexamined Patent Application, First Publication No. 2011-150469

SUMMARY OF THE INVENTION

Problems to be Solved by the Invention

The method described in Patent Document 1 has the following problems. (A) The fault page notification part 62 is installed in FW called a basic input/output system (BIOS). The BIOS registers a page in which an error has occurred in a table, counts the number of times an error has occurred for each page, and notifies, when the number of errors occurring exceeds a threshold value, the page blocking part 63 of a page in which the number of errors occurring exceeds the threshold value. The page blocking part 63 installed in the OS performs page blockage on the notified page. Here, since the FW called a BIOS performs the searching of the table, the registration, and the counting of the number of times an error has occurred, during that processing, the OS cannot use a CPU. For this reason, a CPU usage rate of the OS temporarily drops. (B) As long as the above function is realized in the BIOS or the OS, the above function cannot be realized to provide a notification concerning all pages in which errors have occurred indefinitely. For this reason, providing an upper limit value to the number of notified pages is required. That is to say, there is a restriction that the fault page notification part 62 cannot notify of all pages in which an error has occurred and the page blocking part 63 cannot block all of the pages in which an error has occurred.

When the method of Patent Document 1 is applied to in-memory computing in which a frequency of errors to occur is likely to increase along with an increase in capacity of a memory, the above points serve as constraints and thus it is not possible to handle a memory fault. Thus, this is likely to lead to a system down or the like.

Therefore, an example of an object of the present invention is to provide a memory fault handling system, an information processing device, and a memory fault handling method capable of solving the above problems.

Means for Solving the Problems

According to an aspect of the present invention, a memory fault handling system includes: a memory controller, firmware, and software. The memory controller has: an error occurrence notification means for, when the occurrence of a memory error is detected, notifying firmware or software of the occurrence of a memory error on the basis of a setting pertaining to a notification recipient. The firmware includes: a notification recipient setting means for setting a notification recipient for the memory controller; and a spare memory switching instruction means for, when a notification indicating the occurrence of a memory error is received from the memory controller, instructing to switch from a memory in which the memory error has occurred to a spare memory. The software includes: a disabling instruction means for, when a notification indicating the occurrence of a memory error is received from the memory controller, instructing to cause a page corresponding to the memory in which the memory error has occurred to be disabled.

Also, according to another aspect of the present invention, an information processing device includes the memory fault handling system.

Furthermore, according to another aspect of the present invention, a memory fault handling method includes: a step of setting, by firmware, a notification recipient when a memory error occurs for a memory controller; a step of notifying, by the memory controller, when an occurrence of a memory error is detected, the firmware or software of the occurrence of a memory error on the basis of the setting of the notification recipient; a step of instructing, by the firmware, when a notification indicating the occurrence of a memory error is received from the memory controller, to switch from a memory in which the memory error has occurred to a spare memory; and a step of instructing, by the software, when the notification indicating the occurrence of the memory error is received from the memory controller, to cause a page corresponding to the memory in which the memory error has occurred to be disabled.

Advantageous Effects of Invention

According to the present invention, it is possible to effectively handle the occurrence of a memory CE by linking the spare memory switching function by means of HW and a page offline function by means of SW.

EXAMPLE EMBODIMENT

Control when a memory error occurs according to an embodiment of the present invention will be described below with reference to the drawings.

(Constitution)

Figure 1:
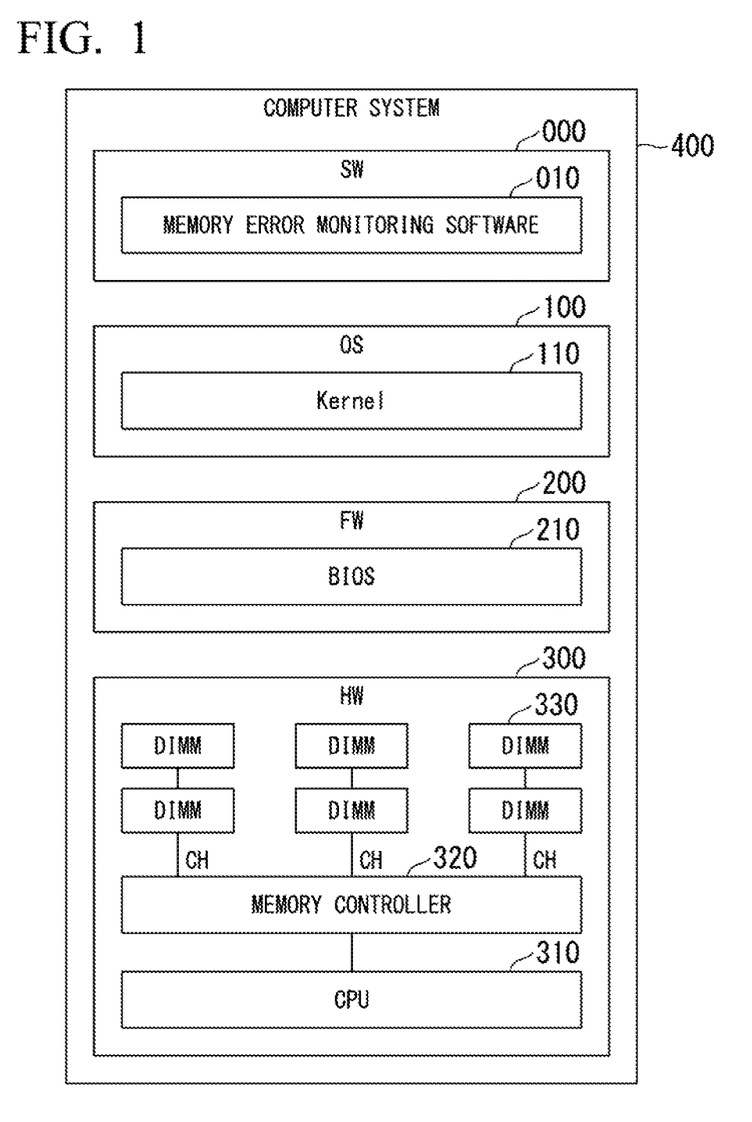
FIG. 1 is a diagram illustrating an example of a computer system according to an embodiment of the present invention.

FIG. 1 is a diagram illustrating an example of a computer system according to an embodiment of the present invention.

As illustrated in FIG. 1, a computer system 400 includes hardware (HW) 300, firmware (FW) 200, an operating system (OS) 100, and software (SW) 000.

The HW 300 includes a central processing unit (CPU) 310, a memory controller 320, and one or more dynamic random access memories (DIMMs) 330. The memory controller 320 includes one or more channels (hereinafter referred to as "CHs"). Each DIMM 330 is connected any of the CHs. The DIMM 330 is a memory module. The memory controller 320 has a function for detecting the occurrence of a memory correctable error (CE) in the DIMM 330 and an HW function (a data copy function to a spare DRAM).

The FW 200 includes a basic input/output system (BIOS) 210. The BIOS 210 has a function for effectively linking the HW function and the SW function between the HW 300 and the OS 100.

The OS 100 includes a kernel (Kernel) 110. The kernel 110 has a SW function (a page offline function).

The SW 000 includes memory error monitoring software 010. The memory error monitoring software 010 instructs the execution of the SW function.

When an EC occurs in the DIMM 330 in the computer system 400, the OS 100, the FW 200, and the HW 300 handle a memory error in cooperation with each other.

Figure 2A:
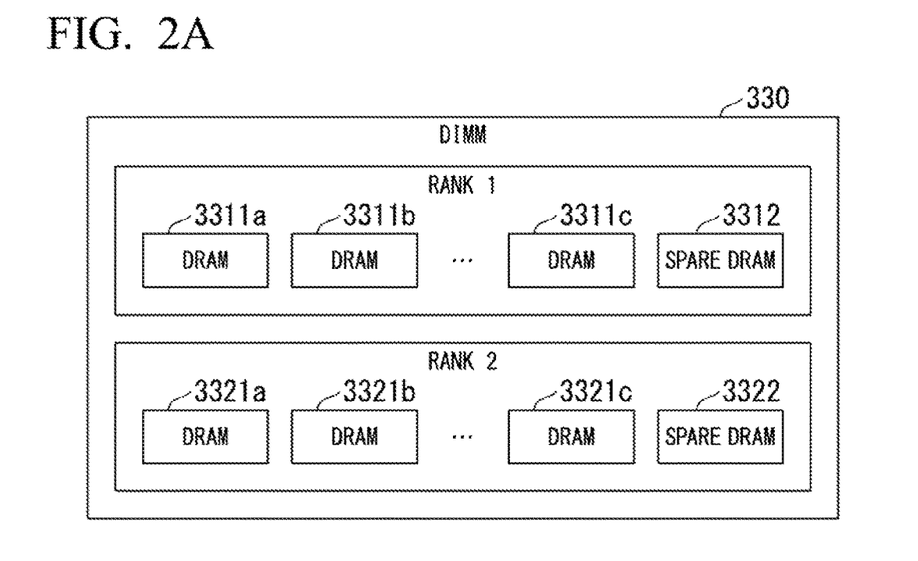
FIG. 2A is a diagram illustrating a memory and an example of the memory according to the embodiment of the present invention.
Figure 2B:
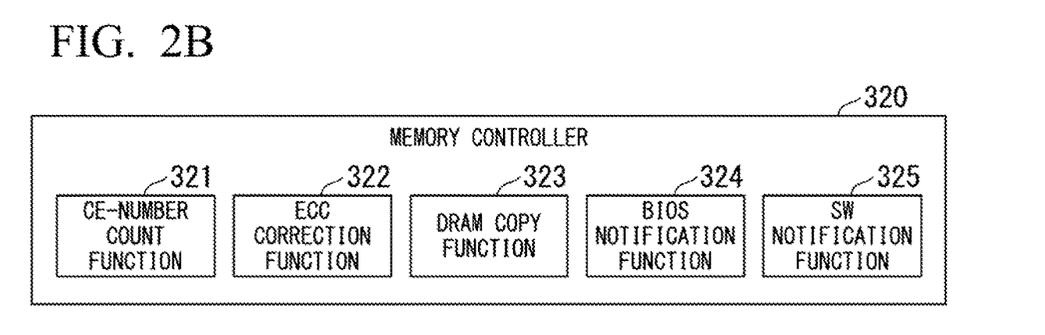
FIG. 2B is a diagram illustrating an example of a memory and a memory controller according to the embodiment of the present invention.

FIGS. 2A and 2B are a diagram illustrating an example of a memory and a memory controller according to the embodiment of the present invention.

FIG. 2A shows an example of a constitution of the DIMM 330. The DIMM 330 includes rank 1 and rank 2. When distinguishing between rank 1 and rank 2 is not required, rank 1 and rank 2 are referred to as a "rank". The rank indicates a block of memory modules. The memory controller 320 manages memory modules in units of rank. Rank 1 includes a plurality of DRAMs 3311a to 3311c and at least one spare DRAM 3312. Rank 2 includes a plurality of DRAMs 3321a to 3321c and at least one spare DRAM 3322.

When distinguishing between the DRAMs 3311a to 3311c is not required, the DRAMs 3311a to 3311c are referred to as a "DRAM 3311". When distinguishing between the DRAMs 3321a to 3321c is not required, the DRAMs 3321a to 3321c are referred to as a "DRAM 3321". Furthermore, when referring to a DRAM included in the DIMM 330 without the need to distinguish between the ranks, the DRAM is referred to as a "DRAM 3301", and when referring to the spare DRAM, the spare DRAM is referred to as a "spare DRAM 3302". The number of ranks and the number of DRAMs are not limited to those shown in the drawings.

FIG. 2B shows an example of a constitution of the memory controller 320. The memory controller 320 includes a CE-number count function 321, an ECC correction function 322, a DRAM copy function 323, a BIOS notification function 324, and an SW notification function 325.

The CE-number count function 321 counts the number of times a memory CE has occurred for each DRAM 3301.

The ECC correction function 322 corrects an error correction code (ECC) when a memory CE occurs in the DRAM 3301. The error correction code is a code to be added so that an error generated at the time of recording or transmitting data can be detected and corrected on a reception side.

The DRAM copy function 323, for example, copies data from the DRAM 3301 to be switched to the spare DRAM 3302 at the time of switching from the DRAM 3301 to the spare DRAM 3302. For example, when more than the threshold number of times of memory CEs occur in the DRAM 3311a, data is copied from the DRAM 3311a to the spare DRAM 3312 of the same rank 1.

The BIOS notification function 324 notifies the FW 200 of the occurrence of the memory CE when the number of times a memory CE has occurred exceeds a prescribed threshold value before switching to the spare DRAM 3302.

When a memory CE further occurs after switching to the spare DRAM 3302, the SW notification function 325 notifies the SW 000 (the memory error monitoring software 010) of the occurrence of the memory CE.

Figure 3A:
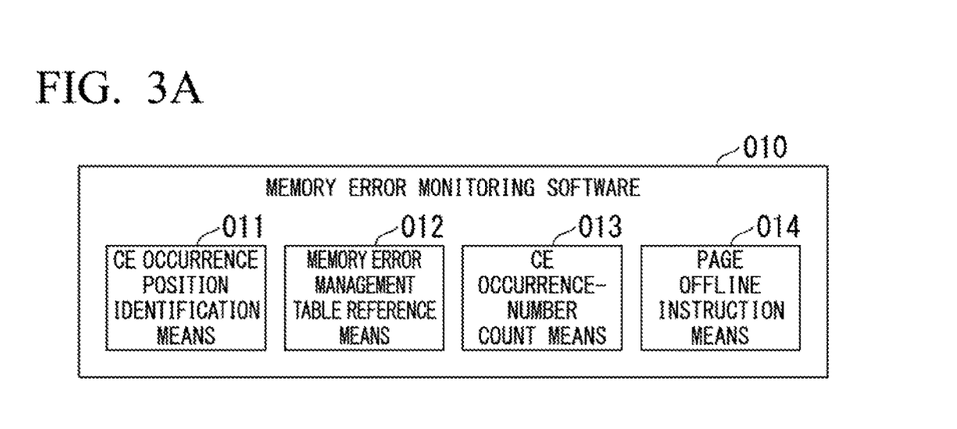
FIG. 3A is a diagram illustrating an example a constitution of memory error monitoring software in a software group associated with a memory error according to the embodiment of the present invention.
Figure 3B:
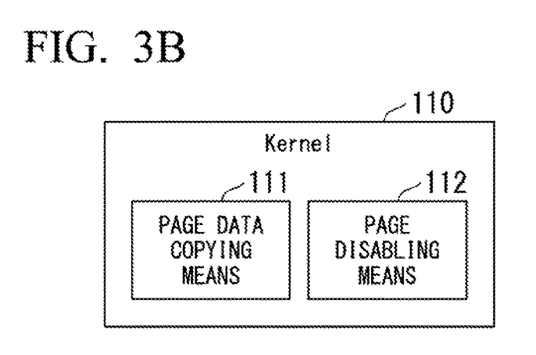
FIG. 3B is a diagram illustrating an example of a constitution of a Kernel in the software group associated with a memory error according to the embodiment of the present invention.

FIGS. 3A and 3B are diagrams showing an example of a software group associated with a memory error according to the embodiment of the present invention.

FIG. 3A illustrates an example of a constitution of the memory error monitoring software 010. The memory error monitoring software 010 has a CE occurrence position identification means 011, a memory error management table reference means 012, a CE occurrence-number count means 013, and a page offline instruction means 014.

The CE occurrence position identification means 011 specifically identifies a DRAM 3301 in which a memory CE has occurred.

The memory error management table reference means 012 acquires information indicating whether data copying to the spare DRAM 3302 has been executed for the DRAM 3301 in which a memory CE has occurred with reference to a memory error management table 500 which will be described later with reference to FIG. 4.

The CE occurrence-number count means 013 counts the number of memory CEs corresponding to a notification from the memory controller 320 on a page-by-page basis.

When the number of times a CE has occurred counted by means of the CE occurrence-number count means 013 exceeds a threshold value, the page offline instruction means 014 instructs the Kernel 110 to cause a page in which the number of times a memory CE has occurred exceeds a threshold value to be disabled.

FIG. 3B illustrates an example of a constitution of the Kernel 110. The Kernel 110 has a page data copying means 111 and a page disabling means 112.

The page data copying means 111 copies data from a page to be disabled to an available page before the page is disabled.

The page disabling means 112 causes a page designated by means of the memory error monitoring software 010 (the page offline instruction means 014) to be disabled.

Figure 3C:
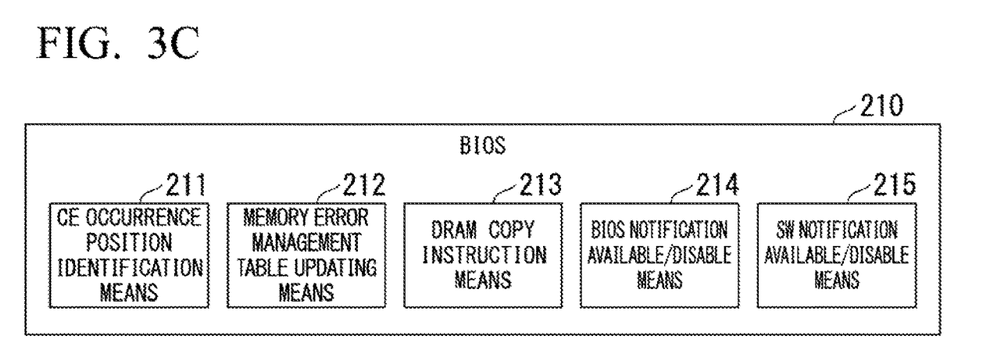
FIG. 3C is a diagram illustrating an example of a constitution of a BIOS in the software group associated with a memory error according to the embodiment of the present invention.

FIG. 3C illustrates an example of a constitution of the BIOS 210. The BIOS 210 has a CE occurrence position identification means 211, a memory error management table updating means 212, a DRAM copy instruction means 213, a BIOS notification available/disable means 214, and an SW notification available/disable means 215.

The CE occurrence position identification means 211 specifically identifies a DRAM 3301 in which a memory CE has occurred.

The memory error management table updating means 212 registers information indicating that the HW function has been performed for data, in the memory error management table 500 which will be described later with reference to FIG. 4, which corresponds to a position of a DRAM 3301 on which data copy to the spare DRAM 3302 is performed.

The DRAM copy instruction means 213 instructs the memory controller 320 to copy the data of the DRAM 3301 to the spare DRAM 3302 for the DRAM 3301 in which the number of times a memory CE has occurred exceeds a threshold value. This instruction is an execution instruction for the HW function.

The BIOS notification available/disable means 214 sets whether to notify the BIOS 210 of the occurrence of memory CE when the memory CE has occurred in the DRAM 3301.

The SW notification available/disable means 215 sets whether to notify the memory error monitoring software 010 of the occurrence of memory CE when the memory CE has occurred in the DRAM 3301.

Figure 4:
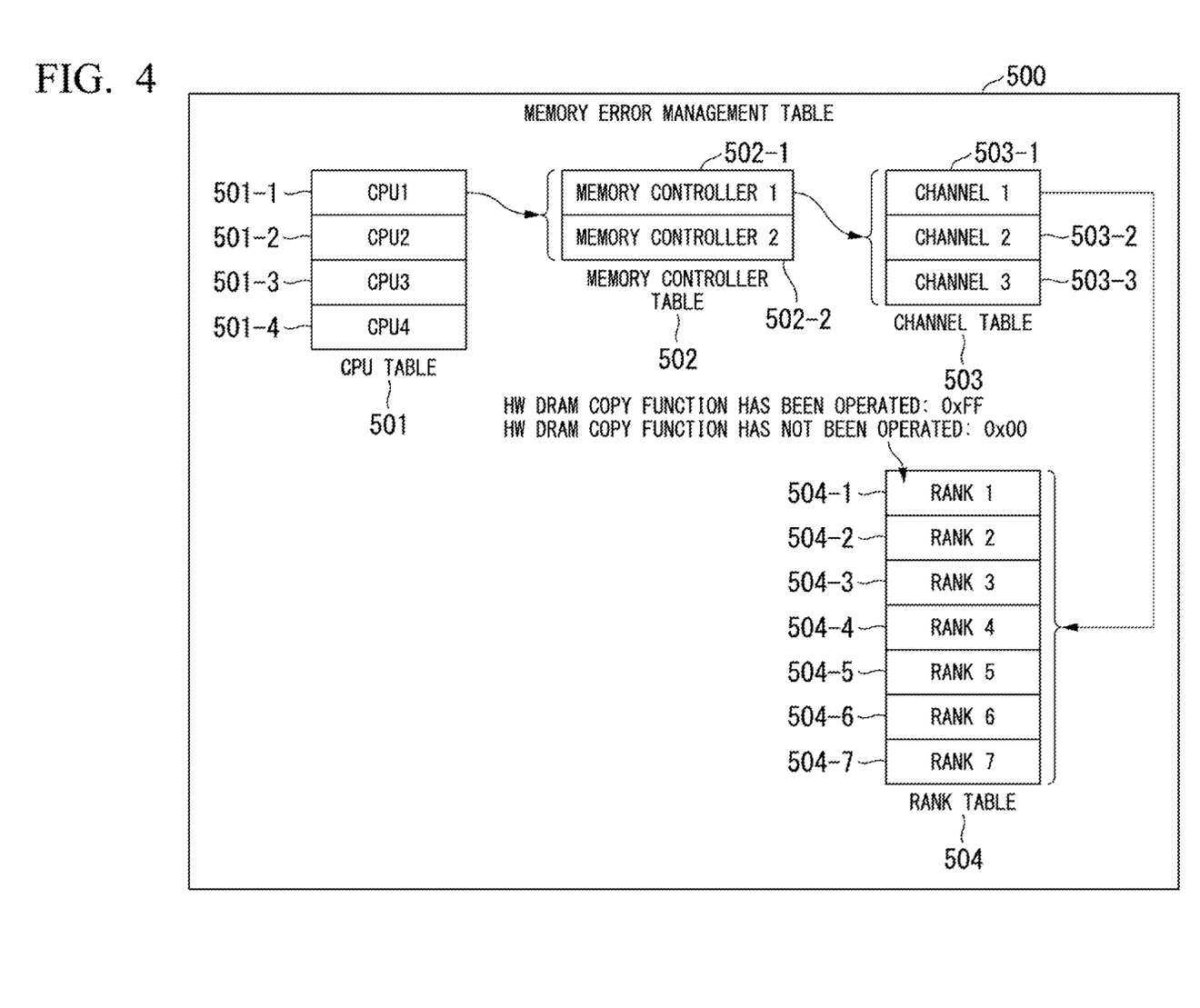
FIG. 4 is a diagram illustrating an example of a memory error management table according to the embodiment of the present invention.

FIG. 4 is a diagram illustrating an example of the memory error management table according to the embodiment of the present invention.

As illustrated in FIG. 4, the memory error management table 500 includes a CPU table 501. The CPU table 501 includes a memory controller table 502. The memory controller table 502 includes a channel table 503. The channel table 503 includes a rank table 504.

As an example, FIG. 4 illustrates the memory error management table 500 of the computer system 400 having four CPUs 301, two memory controllers 302 for each of the CPUs 301, three CHs for each of the memory controllers 302, and sevens ranks for each of the CHs provided therein. As described above, ranks indicate blocks of memory modules.

When the computer system 400 has such a constitution, as shown in the drawing, the memory error management table 500 includes CPU tables 501-1 to 501-4 corresponding to CPU 1 to CPU 4 (the four CPUs 301). Furthermore, for example, the CPU table 501-1 corresponding to CPU 1 includes memory controller tables 502-1 and 502-2 corresponding to the two memory controllers 302. In addition, for example, the memory controller table 502-1 includes channel tables 503-1 to 503-3 corresponding to the three CHs. Moreover, for example, the channel table 503-1 includes rank tables 504-1 to 504-7 corresponding to the seven ranks.

Also, each of the rank tables 504-1 to 504-7 has a value indicating that the HW function has been performed on a corresponding memory module (for example, 0xFF) or a value indicating that the HW function has not been performed on a memory module (for example, 0x00) stored therein. In an initial state, each of the rank tables 504-1 to 504-7 has a value, i.e., "0x00", stored therein.

When instructing the memory controller 320 to perform the HW function, the BIOS 210 writes a value, i.e., "0xFF", in the rank table 504 (for example, the rank table 504-1) corresponding to the rank including the DRAM 3301. The memory error monitoring software 010 confirms the value, i.e., "0xFF", stored in the rank table 504 and then provides an instruction to cause a page to be disabled. Thus, first, an order of processing of operating the HW function and then operating the SW function is secured.

The BIOS 210 performs writing on the memory error management table 500 by means of the memory error management table updating means 212. The memory error monitoring software 010 performs reading on the memory error management table 500 by means of the memory error management table reference means 012. Therefore, the memory error management table 500 is stored in a sharing memory or the like which is accessible by means of the BIOS 210 and the memory error monitoring software 010.
(Operation)

An operation when a memory CE occurs will be described below.

Figure 5:
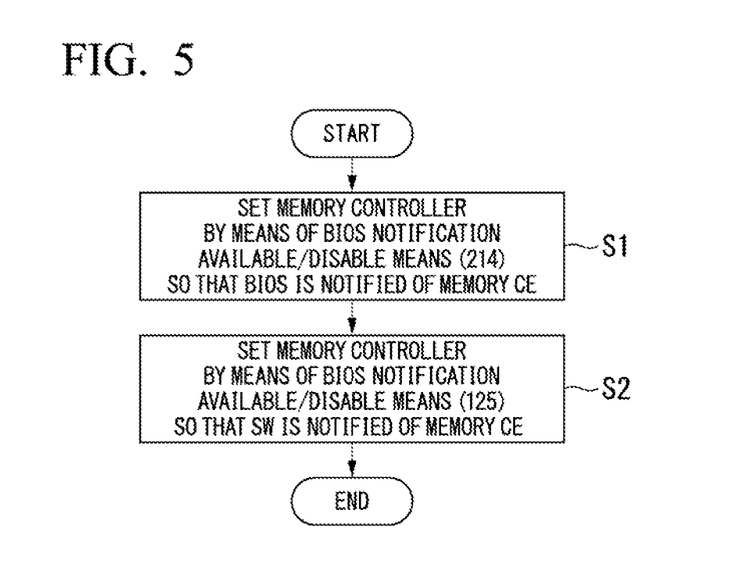
FIG. 5 is a first flowchart showing an example of control according to the embodiment of the present invention.

FIG. 5 is a first flowchart showing an example of control according to the embodiment of the present invention.

FIG. 5 illustrates a process for performing initial settings pertaining to a notification recipient when a CE occurs.

The BIOS 210 sets the memory controller 320 by means of the BIOS notification available/disable means 214 so that the BIOS 210 is notified of the occurrence of the memory CE (Step S1). Furthermore, the BIOS 210 set the memory controller 320 by means of the SW notification available/disable means 215 so that the SW 000 is not notified of the occurrence of memory CE (Step S2).

The memory controller 320 receives these settings and performs settings to cause the BIOS notification function 324 to be available and cause the SW notification function 325 to be disabled. When memory CEs corrected by means of the ECC correction function 322 are generated to exceed a threshold value by virtue of these initial settings, the BIOS notification function 324 notifies the BIOS 210 of this notification.

An operation when a memory CE occurs in a state in which initial settings (S1 and S2 in FIG. 5) has been performed will be described below with reference to FIG. 6.

Figure 6:
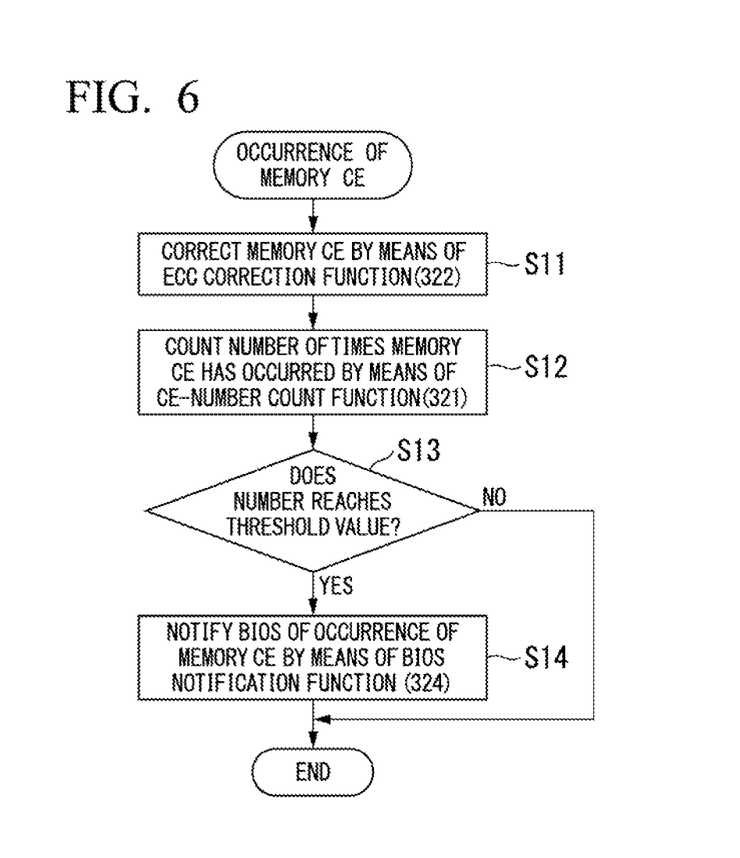
FIG. 6 is a second flowchart showing an example of control according to the embodiment of the present invention.

FIG. 6 is a second flowchart showing an example of control according to the embodiment of the present invention.

A memory controller 320 in which a memory CE has occurred corrects the memory CE by means of the ECC correction function 322 (Step S11). The memory controller 320 counts the number of times a memory CE has occurred for each DRAM 3301 by means of the CE-number count function 321 (Step S12).

The memory controller 320 confirms whether the number of times a memory CE has occurred in the DRAM 3301 in which the memory CE has occurred reaches a threshold value (Step S13). When it is determined that the number does not reach the threshold value (NO in Step S13), the process shown in FIG. 6 ends. When it is determined that the number reaches the threshold value (YES in Step S13), the memory controller 320 notifies the BIOS 210 of the occurrence of memory CE by means of the BIOS notification function 324 (Step S14).

When the BIOS 210 receives a notification of the occurrence of memory CE, first, the data of the DRAM 3301 in which an error has occurred is transferred to the spare DRAM 3302 by means of the HW function. A flow of a series of processes associated with the HW function will be described below with reference to FIG. 7.

Figure 7:
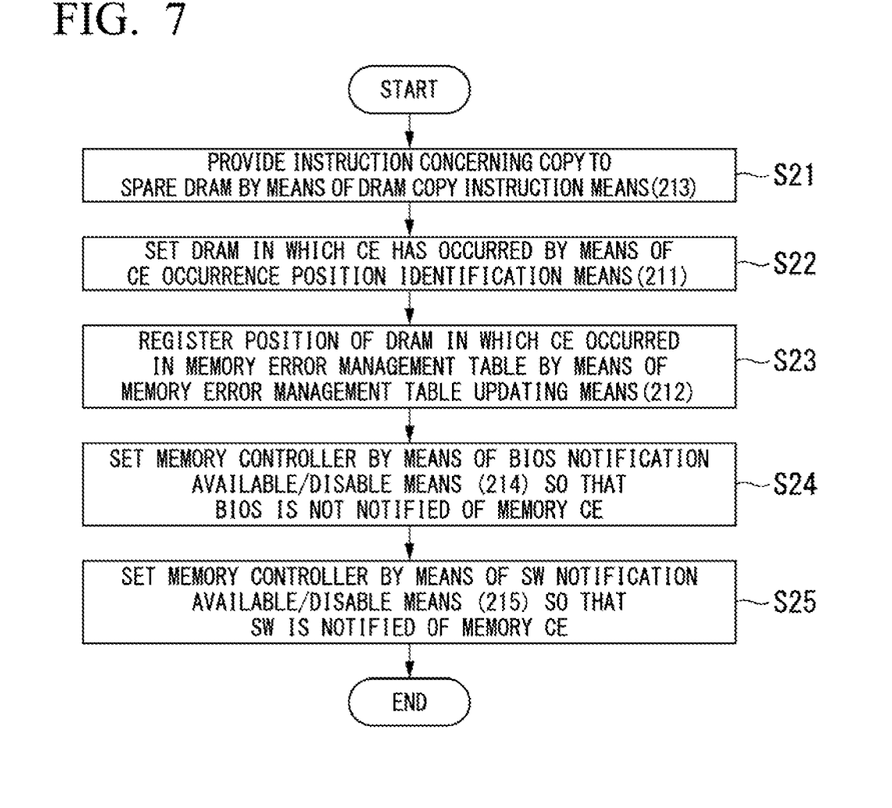
FIG. 7 is a third flowchart showing an example of control according to the embodiment of the present invention.

FIG. 7 is a third flowchart showing an example of control according to the embodiment of the present invention. FIG. 7 illustrates a process when the number of times a memory CE has occurred reaches a threshold value (YES in S13) and a notification is output to the BIOS 210 (S14 in FIG. 6).

The BIOS 210 which has received the notification of the occurrence of memory CEs instructs the memory controller 320 by means of the DRAM copy instruction means 213. The BIOS 210 instructs the memory controller 320 to copy the data of the DRAM 3301 in which a memory CE has occurred to the spare DRAM 3302 (Step S21). The memory controller 320 operates the HW function by copying data from the designated DRAM 3301 to the spare DRAM 3302 of the same rank by means of the DRAM copy function 323 in response of this instruction.

The BIOS 210 specifically identifies the DRAM 3301 in which a memory CE has occurred by means of the CE occurrence position identification means 211 (Step S22). The BIOS 210 registers a position of the DRAM 3301, in which a memory CE has occurred, in the memory error management table 500 by means of the memory error management table updating means 212 (Step S23). The position of the DRAM 3301 indicates, for example, information for specifically identifying a rank including the DRAM 3301.

Here, for example, a case in which the position of the DRAM in which a memory CE has occurred is "CPU 1-memory controller 1-channel 1-rank 1" will be exemplified. In this case, the BIOS 210 registers a value (for example, "0xFF") indicating that the HW function has been operated (the operation of Step 1 has been performed) on a position, of the memory error management table 500 illustrated as an example in FIG. 4, which corresponds to "CPU 1-memory controller 1-channel 1-rank 1". That is to say, the BIOS 210 writes the value "0xFF" in an area in the memory error management table 500 corresponding to a rank to which the DRAM 3301 in which a memory CE has occurred belongs.

Subsequently, the BIOS 210 sets the memory controller 320 by means of the BIOS notification available/disable means 214 so that the BIOS 210 is not notified of a memory CE generated in a rank in which the HW function has been operated (Step S24). The BIOS 210 sets the memory controller 320 by means of the SW notification available/disable means 215 so that the SW 000 (the memory error monitoring software 010) is notified of the occurrence of memory CE in any DRAM 3301 of a plurality of DRAMs 3301 belonging to a rank in which the HW function has been operated (Step S25).

Thus, after that, when a memory CE occurs in another DRAM 3301 or the like among the plurality of DRAMs 3301 belonging to the rank in which the HW function is operated, the memory error monitoring software 010 is notified of the occurrence of the memory CE. This is because, when the HW function has already been operated for any DRAM 3301 among the plurality of DRAMs 3301 belonging to the same rank, performing handling by means of the SW function is required because there is no spare DRAM 3302. The number of times a memory CE has occurred is counted by means of the memory error monitoring software 010, and when the number of times exceeds a threshold value (which will be described later with reference to FIG. 9), the data of a page on which an error has occurred is transferred to another page by means of the SW function.

Figure 8:
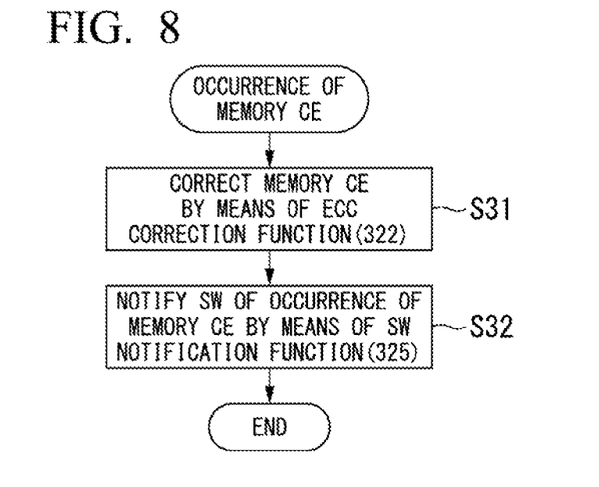
FIG. 8 is a fourth flowchart showing an example of control according to the embodiment of the present invention.

FIG. 8 illustrates a flow of a process when the occurrence of a memory CE of a DRAM 3301 belonging to a rank in which the HW function is operated is detected below.

FIG. 8 is a fourth flowchart showing an example of control according to the embodiment of the present invention.

When detecting the occurrence of a memory CE in any DRAM 3301 belonging to a rank in which the HW function has been operated, the memory controller 320 corrects the memory CE by means of the ECC correction function 322 (Step S31). Subsequently, the memory controller 320 notifies the memory error monitoring software 010 of the occurrence of memory CE by means of the SW notification function 325 on the basis of the fact that the HW function has been operated (without counting the number of CEs) (Step S32). An operation of the memory error monitoring software 010 which has received a notification concerning the occurrence of memory CE will be described with reference to FIG. 9.

Figure 9:
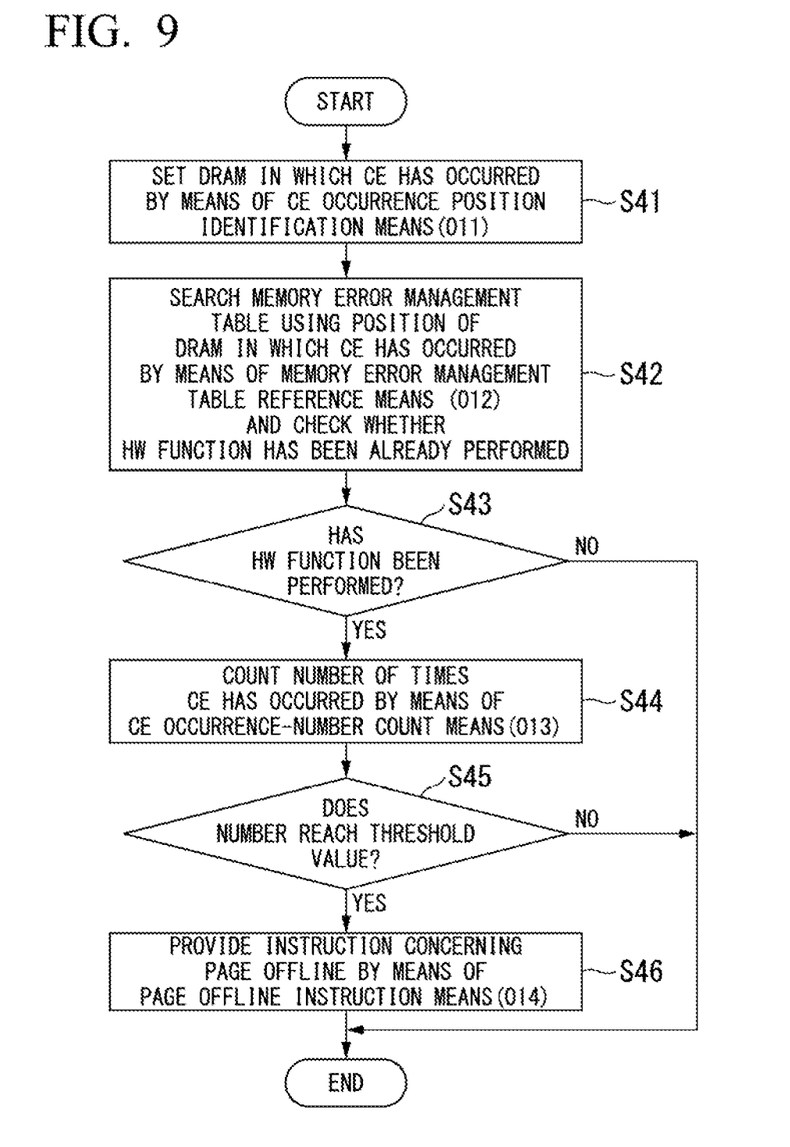
FIG. 9 is a fifth flowchart showing an example of control according to the embodiment of the present invention.

FIG. 9 is a fifth flowchart showing an example of control according to the embodiment of the present invention.

The memory error monitoring software 010 specifically identifies a DRAM 3301 in which a memory CE has occurred by means of the CE occurrence position identification means 011 (Step S41). Subsequently, the memory error monitoring software 010 check whether the HW function has been performed on the DRAM 3301 in which a memory CE has occurred and which has been specifically identified in Step S41 by means of the memory error management table reference means 012 (Step 42 and Step S43). To be specific, the memory error monitoring software 010 searches the memory error management table 500 using a position of the DRAM 3301 in which specifically identified memory CE has occurred as a key and checks whether the HW function has been operated.

When the HW function is not yet operated (NO in Step S43), the process of FIG. 9 ends. When the HW function has already been operated (YES in Step S43), the memory error monitoring software 010 counts the number of times a CE has occurred on a page-by-page basis by using means of the CE occurrence-number count means 013 (Step S44). The CE occurrence-number count means 013 counts the number of times a CE has occurred for a page (in which the DRAM 3301 is mapped) corresponding to the DRAM 3301 specifically identified in Step S41. For example, a plurality of DRAMs 3301 are mapped on the page.

The memory error monitoring software 010 confirms whether the number of times a CE has occurred on a page corresponding to the specifically identified DRAM 3301 reaches a threshold value (Step S45). When it is determined that the number does not reach the threshold value (NO in Step S45), the process of FIG. 9 end. When it is determined that the number reaches the threshold value (YES in Step S45), the memory error monitoring software 010 designates a page to be disabled by means of the page offline instruction means 014 and instructs the Kernel 110 to perform page offline (Step S46).

In this way, when the HW function has been operated within the rank of the DRAM 3301 in which an error has occurred, the SW function is performed on a page to which the DRAM 3301 is mapped in accordance with the number of times a CE has occurred on the page. The threshold value used in Step S45 of FIG. 9 and the threshold value used in Step S13 of FIG. 6 may have the same value or different values. That is to say, the threshold value for determining whether to operate the HW function and the threshold value for determining whether to operate the SW function may be the same or different.

Figure 10:
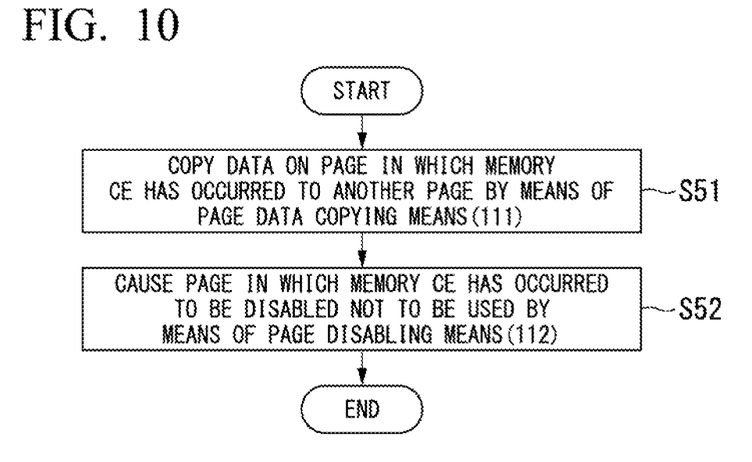
FIG. 10 is a sixth flowchart showing an example of control according to the embodiment of the present invention.

FIG. 10 is a sixth flowchart showing an example of control according to the embodiment of the present invention. An operation of the Kernel 110 when an instruction for a page offline is provided (S46 in FIG. 9) will be described with reference to FIG. 10.

The Kernel 110 copies data, on a page designated from the memory error monitoring software 010, to another page by means of the page data copying means 111 (Step S51). Subsequently, the Kernel 110 causes a page, in which a memory CE has occurred designated from the memory error monitoring software 010, to be disabled not to be used, by means of the page disabling means 112 (Step S52). Thus, the SW function has been performed.

Registration and reference of the memory error management table 500 will be described below with reference to a specific example.

For example, in Step S22 of FIG. 7, a case in which the BIOS 210 specifically identifies that a position of a DRAM in which a memory CE has occurred is "CPU 1-memory controller 1-channel 1-rank 1" is exemplified. In this case, in Step S23, the BIOS 210 registers a value, indicating that the HW function (data copy to the spare DRAM) has been operated, in a position corresponding to "CPU 1-memory controller 1-channel 1-rank 1" of the memory error management table 500 illustrated in FIG. 4.

Also, in Step S41 of the process of FIG. 9, the memory error monitoring software 010 specifically identifies that a position of a DRAM 3301 in which a memory CE has occurred is "CPU 1-memory controller 1-channel 1-rank 1". That is to say, the memory error monitoring software 010 identifies a rank of a DRAM 3301 in which a memory CE has occurred. Moreover, the memory error monitoring software 010 confirms that the HW function has been operated, with reference to a value of a position corresponding to "CPU 1-memory controller 1-channel 1-rank 1" of the memory error management table 500.

Also, the memory error monitoring software 010 counts the number of times a memory CE has occurred in Step S44. When a memory CE occurs in a DRAM 3301 belonging to rank 1, the memory error monitoring software 010 counts the number of times a memory CE has occurred on a page to which the DRAM 3301 is mapped. When it is determined that the number of times a memory CE has occurred reaches a threshold value (YES in Step S45), in Step S46, the memory error monitoring software 010 operates the SW function (a page offline) for the page. In this way, in the embodiment, the SW function is operated after it is confirmed that the HW function has been performed on the basis of the memory error management table 500.

According to the embodiment, the memory error management table 500 is created in the FW 200 located between the HW 300 and the SW 000. Furthermore, when a memory CE occurs, a notification is first provided to the FW 200 and the FW 200 operates the HW function. In addition, the FW 200 registers a position of a DRAM 3301 in which the HW function is operated in the memory error management table 500.

Also, the FW 200 is set so that a notification is output to the SW 000 when the next memory CE occurs in any DRAM 3301 in a rank in which the HW function has been operated. In addition, when a memory CE occurs, a notification is output to the SW 000. When the SW 000 recognizes a memory CE, a DRAM 3301 in which a memory CE has occurred is specifically identified and confirmation concerning whether the HW function has been operated is performed on the specifically identified DRAM 3301 with reference to the memory error management table 500. When the HW function has been operated, the SW 000 operates the page offline function in accordance with the number of times a memory CE has occurred on a page corresponding to the specifically identified DRAM 3301.

Thus, it is possible to realize the control in which the HW function is operated first when a memory CE has occurred, and the SW function is operated when a memory CE occurs also after the operation of the HW function.

Also, as described above, according to the embodiment, the HW function operates before the SW function by means of a setting process (FIG. 5) of a notification recipient of a memory CE error using the BIOS 210. In the setting process of FIG. 5, the setting is performed so that the BIOS 210 is notified of the occurrence of memory CE and the notification is not provided to the SW 000. For this reason, if the occurrence of memory CE is minimized by means of the HW function, the SW function (a page offline) does not operate. In this case, the operation of the computer system 400 can be continuously performed without being affected by (1) a decrease in the number of memory pages which are available by a user and (2) the occurrence of an overhead which is the transferring of data by means of the kernel.

When it is determined that a memory CE further occurs also after the HW function has been operated, at that point, the SW function is operated. Thus, it is possible to prevent the computer system 400 from going down by virtue of uncorrectable errors (UCEs) which are memory CEs occurring at multiple positions at the same time.

Also, in the embodiment, based on the settings of the BIOS notification available/disable means 214 and the SW notification available/disable means 215 of the BIOS 210, before the HW function is performed, the memory controller 320 notifies the BIOS 210 of the occurrence of memory CE. Furthermore, after the HW function has been performed, the memory controller 320 notifies the memory error monitoring software 010 of the occurrence of memory CE. In addition, the memory error monitoring software 010 is notified of the position of the DRAM 3301 corresponding to the page in which it is required to be disabled via the memory error management table 500. For this reason, it is efficient because a notification concerning the page to be disabled (closed) by means of the BIOS 210 is not required.

Furthermore, the memory error monitoring software 010 confirms the position of the DRAM 3301 with reference to the memory error management table 500 and causes the page corresponding to the position of the confirmed DRAM 3301 to be disabled. Thus, it is efficient because there is no need to search the page to be disabled.

Therefore, also in an in-memory computing environment in which the frequency of errors to occur is likely to increase when the memory capacity increases, it is possible to handle a memory fault without delay.

In addition, information regarding a (finite) DRAM 3301, which is actually installed in the computer system 400, is registered in the memory error management table 500. Thus, no matter which DRAM 3301 the memory CE occurs in, it is possible to perform handing by means of the above process based on the memory error management table 500. Therefore, there are no restrictions such as setting an upper limit value concerning the number of pages which can be disabled.

Figure 11:
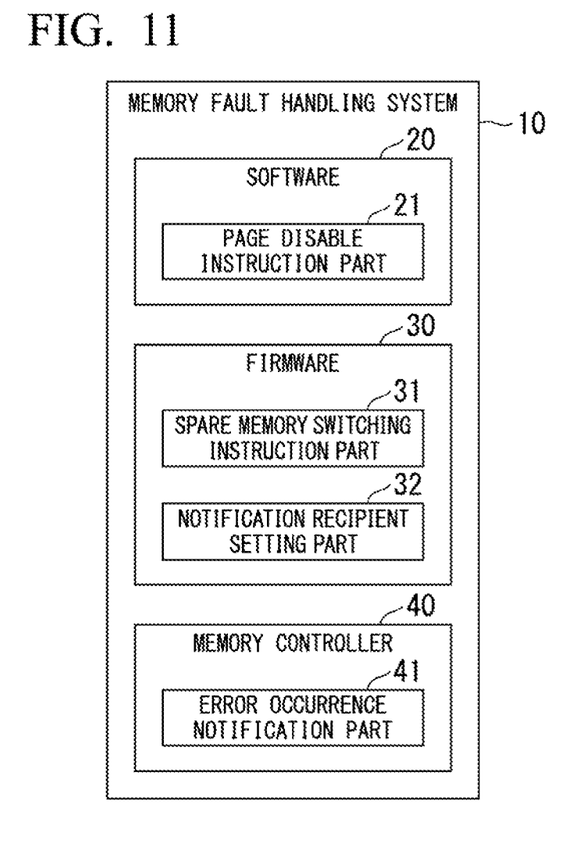
FIG. 11 is a diagram illustrating a minimum constitution of a memory fault handling system according to the embodiment of the present invention.

FIG. 11 is a diagram illustrating a minimum constitution of a memory fault handling system according to the embodiment of the present invention.

As shown in FIG. 11, a memory fault handling system 10 includes at least software 20, firmware 30, and a memory controller 40.

When detecting the occurrence of memory error (CE), the memory controller 40 has an error occurrence notification part 41 which notifies the firmware 30 or the software 20 of the occurrence of memory error.

The software 20 has a disable instruction part 21. When receiving the notification of the occurrence of memory error from the memory controller 320, a disable instruction part 21 instructs the kernel to cause a page corresponding to a memory in which a memory error has occurred to be disabled.

The firmware 30 has a spare memory switching instruction part 31 and a notification recipient setting part 32. The notification recipient setting part 32 sets a notification recipient (the software 20 or the firmware 30) of the occurrence of memory error when the memory controller 40 detects the occurrence of memory error, with respect to the memory controller 40. When receiving a notification of the occurrence of memory error from the memory controller 40, the spare memory switching instruction part 31 instructs the memory controller 40 to perform switching from a memory in which a memory error has occurred to a spare memory.

In comparison with the constitution of the above embodiment, the software 20 corresponds to the memory error monitoring software 010, the firmware 30 corresponds to the BIOS 210, and the memory controller 40 corresponds to a memory controller 230.

Also, the error occurrence notification part 41 corresponds to the BIOS notification function 324 and the SW notification function 325 and the page disable instruction part 21 corresponds to the page offline instruction means 014. In addition, the spare memory switching instruction part 31 corresponds to the DRAM copy instruction means 213 and the notification recipient setting part 32 corresponds to the BIOS notification available/disable means 214 and the SW notification available/disable means 215.

The process of each process using each means of the memory error monitoring software 010, each means of the Kernel 110, and each means of the BIOS 210 is stored in a computer-readable recording medium in the form of a program. The above processing is performed when the CPU 310 reads and executes this program. Here, the computer-readable recording medium includes a magnetic disk, a magneto-optical disk, a CD-ROM, a DVD-ROM, a semiconductor memory, and the like. Furthermore, this computer program may be distributed to a computer via a communication line and the computer receiving the distribution may execute the program. In addition, the above program may be for realizing a part of the above-described functions. Moreover, the above program may be a so-called difference file (a difference program) which can realize the above-described functions in combination with a program already recorded in a computer system.

In addition, it is possible to replace the constituent elements in the above-described embodiment with well-known constituent elements as appropriate without departing from the gist of the present invention. Furthermore, the technical scope of the present invention is not limited to the above-described embodiment and various modifications are possible without departing from the gist of the present invention. The computer system 400 is an example of an information processing device.

Priority is claimed on Japanese Patent Application No. 2019-051453, filed Mar. 19, 2019, the content of which is incorporated herein by reference.

INDUSTRIAL APPLICABILITY

According to the present invention, it is possible to effectively handle the occurrence of memory CE by linking a spare memory switching function using HW and a page offline function using SW.

REFERENCE SIGNS LIST

000 SW
010 Memory error monitoring software
011 CE occurrence position identification means
012 Memory error management table reference means
013 CE occurrence-number count means
014 Page offline instruction means
100 OS
110 Kernel
111 Page data copy means
112 Page disabling means
200 FW
210 BIOS
211 CE occurrence position identification means
212 Memory error management table updating means
213 DRAM copy instruction means
214 BIOS notification available/disable means
215 SW notification available/disable means
300 HW
310 CPU
320 Memory controller
321 CE-number count function
322 ECC correction function
323 DRAM copy function
324 BIOS notification function
325 SW notification function
330 DIMM
3311, 3321 DRAM
400 Computer system
500 Memory error management table
501 CPU table
502 Memory controller table
503 Channel table
504 Rank table

What is claimed is:

1. A memory fault handling system comprising:
a memory controller managing a plurality of memories;
firmware storing a memory error management table in which information is registered, the information indicating, for each of the plurality of memories, whether the each of the plurality of memories has been switched to a spare memory; and
software,
wherein the memory controller, when an occurrence of a memory error is detected, notifies the firmware or the software of the occurrence of the memory error based on a setting pertaining to a notification recipient,
the firmware:
sets the notification recipient for the memory controller; and
when the notification indicating the occurrence of the memory error in a memory of the plurality of memories is received from the memory controller, provides an instruction to switch from the memory in which the memory error has occurred to the spare memory, and updates the memory error management table, and
the software:
when the notification indicating the occurrence of the memory error is received from the memory controller, references the memory error management table and provides an instruction to cause a page corresponding to the memory in which the memory error has occurred to be disabled.

2. The memory fault handling system according to claim 1, wherein the firmware sets the firmware as the notification recipient before providing the instruction to switch to the spare memory and sets the software as the notification recipient after providing the instruction to switch to the spare memory.

3. The memory fault handling system according to claim 1, wherein the firmware registers, when providing the instruction to switch to the spare memory, the information indicating that the memory in which the memory error has occurred has been switched to the spare memory in the memory error management table.

4. The memory fault handling system according to claim 1, wherein the software is configured to provide the instruction to cause the page to be disabled when the information indicating that the memory in which the memory error has occurred has been switched has been registered with reference to the memory error management table.

5. The memory fault handling system according to claim 1, wherein the software is configured to provide the instruction to cause the page corresponding to a position of the memory in which the memory error has occurred to be disabled based on the position of the memory as registered in the memory error management table.

6. An information processing device comprising:
a memory fault handling system including:
a memory controller managing a plurality of memories;
firmware storing a memory error management table in which information is registered, the information indicating, for each of the plurality of memories, whether the each of the plurality of memories has been switched to a spare memory; and
software,
wherein the memory controller, when an occurrence of a memory error is detected, notifies the firmware or the software of the occurrence of the memory error based on a setting pertaining to a notification recipient,
the firmware:
sets the notification recipient for the memory controller; and
when the notification indicating the occurrence of the memory error in a memory of the plurality of memories is received from the memory controller, provides an instruction to switch from the memory in which the memory error has occurred to the spare memory, and updates the memory error management table, and the software:
when the notification indicating the occurrence of the memory error is received from the memory controller, references the memory error management table and provides an instruction to cause a page corresponding to the memory in which the memory error has occurred to be disabled.

7. A memory fault handling method comprising:

managing, by a memory controller, a plurality of memories;

storing, by firmware, a memory error management table in which information is registered, the information indicating, for each of the plurality of memories, whether the each of the plurality of memories has been switched to a spare memory;

setting, by the firmware, a notification recipient when a memory error occurs to the memory controller;

notifying, by the memory controller, when an occurrence of the memory error is detected in a memory of the plurality of memories, the firmware or the software of the occurrence of memory error based on a setting pertaining to the notification recipient as has been set by the firmware;

when a notification indicating the occurrence of the memory error is received by the firmware from the memory controller, providing an instruction, by the firmware, to switch from the memory in which the memory error has occurred to the spare memory, and updating the memory error management table; and when the notification indicating the occurrence of the memory error is received by the software from the memory controller, referencing the memory error management table, by the software, and providing an instruction to cause a page corresponding to the memory in which the memory error has occurred to be disabled.

* * * * *